United States Patent
Wood et al.

(10) Patent No.: US 6,259,637 B1
(45) Date of Patent: Jul. 10, 2001

(54) METHOD AND APPARATUS FOR BUILT-IN SELF-REPAIR OF MEMORY STORAGE ARRAYS

(75) Inventors: Timothy J. Wood; Raghuram S. Tupuri; Gerald D. Zuraski, Jr., all of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/728,285

(22) Filed: Dec. 1, 2000

(51) Int. Cl.$^7$ .................................................. G11C 7/00
(52) U.S. Cl. .............................................. 365/200; 365/201
(58) Field of Search ....................................... 365/200, 201

(56) References Cited

U.S. PATENT DOCUMENTS 6,067,260 * 5/2000 Ooishi et al. ........................ 365/200
6,115,828 * 9/2000 Tsutsumi et al. .................... 365/200

* cited by examiner

*Primary Examiner*—Trong Phan
(74) *Attorney, Agent, or Firm*—Williams, Morgan & Amerson, P.C.

(57) ABSTRACT

An integrated circuit device includes a memory array having a plurality of memory cells arranged in a plurality of rows and a plurality of columns. First and second redundant rows of memory cells and a first redundant column of memory cells are provided. A test circuit is coupled to the memory array and is adapted to test a plurality of memory cells coupled to each of the plurality of rows. A control circuit is coupled to the test circuit and is adapted to receive test results from the test circuit, the control circuit being adapted to respond to a detection of a defective memory cell to determine an assignment of at least one of the first and second redundant rows and first redundant column. A first register is coupled to the control circuit and adapted to receive an assignment of the first redundant row in response to a determination by the control circuit, a second register is coupled to the control circuit and adapted to receive an assignment of the first redundant column in response to a determination by the control circuit, and a third register is coupled to the control circuit and adapted to receive an assignment of the second redundant row in response to a determination by the control circuit.

32 Claims, 3 Drawing Sheets

METHOD AND APPARATUS FOR BUILT-IN SELF-REPAIR OF MEMORY STORAGE ARRAYS

BACKGROUND OF THE INVENTION

1. Field of the Invention

This invention relates generally to the replacement of defective memory cells in a semiconductor memory, and, more particularly, to the replacement of defective memory cells using a built-in self-test mechanism.

2. Description of the Related Art

A semiconductor memory device typically includes an array of memory cells, and the array is normally divided into a number of sub-arrays. Memory cells in the array are selected for reading and writing by means of row and column address signals input to the semiconductor memory device. The row and column address signals are processed by address decoding circuitry to select row lines and column lines in the array to access the desired memory cell or memory cells. A common practice in semiconductor memory devices is to implement the decoding at more than one level. For example, a first level decoding may yield data from a plurality of memory cells in the array, while a second level of decoding will select one memory cell, or a subset of memory cells, from the plurality. Thus, an address input to a semiconductor memory device will commonly result in the selection of a plurality of memory cells in the array or sub-array of the memory device, at least at a first level of decoding. That is, a plurality of memory cells will typically be selected by, or respond to, any particular address.

When semiconductor devices are manufactured, defective memory cells may occur in the memory array or in a sub-array. To salvage the semiconductor memory device despite these defective memory cells, and thus to increase overall yield in the manufacturing process, redundancy is commonly implemented. Redundant memory elements are located throughout the memory array, and each sub-array in the memory array will typically have associated with it a plurality of redundant memory elements. When a defective memory cell is detected in a sub-array, redundant decoding circuitry associated with the redundant memory elements for that sub-array may be programmed to respond to the address of the defective memory cell. When the address of the defective memory cell is input to the sub-array, the redundant memory element will respond in place of the defective memory cell. Redundancy and various methods for its implementation are known to those of ordinary skill in the art.

Redundant memory elements generally comprise redundant rows and/or redundant columns. When a defective memory cell is located, the row (or column) on which it is located may be replaced with a redundant row (or column) by programming, or otherwise altering, the row and column decoding circuitry. If a row in the memory array or sub-array contains two or more defective memory cells (each being on a different column), a single redundant row will suffice to "repair" the multiple "bad bits." If a row in the memory array contains a single defective memory cell, either a redundant row or a redundant column may be used to replace the row or column containing the defective memory cell. During testing of memory arrays, numerous defective memory cells may be encountered, and the replacement of defective cells using a limited number of redundant rows and columns becomes complex. Unless the defective cells can be replaced, the memory array will be unsuitable. Moreover, in certain circumstances, a memory cell may be evaluated as defective at one time, whereas during a subsequent task, that memory cell may be evaluated as non-defective. Hence, the process of detecting and replacing defective memory cells has become extremely complex, particularly in view of the ever-increasing numbers of memory cells in memory arrays.

The present invention is directed to overcoming, or at least reducing the effects of, one or more of the problems set forth above.

SUMMARY OF THE INVENTION

In one aspect of the present invention, an integrated circuit device comprises a memory array having a plurality of memory cells arranged in a plurality of rows and a plurality of columns, each row and each column having coupled to it a plurality of memory cells. The integrated circuit device further comprises a first redundant row of memory cells, a first redundant column of memory cells, and a test circuit coupled to the memory array and adapted to test the plurality of memory cells coupled to each of the plurality of rows. The integrated circuit device further comprises a control circuit coupled to the test circuit and adapted to receive test results from the test circuit, the control circuit adapted to respond to a detection of a defective memory cell to determine an assignment of at least one of the first redundant row and first redundant column. A first register is coupled to the control circuit and adapted to receive an assignment of the first redundant row in response to a determination by the control circuit, and a second register is coupled to the control circuit and adapted to receive an assignment of the first redundant column in response to a determination by the control circuit. In addition, a second redundant row of memory and a third register may be provided. The control circuit is adapted to determine an assignment of the second redundant row, and the third register is adapted to receive the assignment of the second redundant row.

In another aspect of the present invention, a method is provided for replacing defective memory cells in a memory array. The method comprises testing a first row of memory cells in the memory array, detecting a first defective memory cell coupled to the first row, providing row information and column information associated with the first defective memory cell to a control circuit, determining an assignment of one of a redundant row and redundant column to replace the first row, and storing the assignment in a register coupled to the control circuit.

BRIEF DESCRIPTION OF THE DRAWINGS

The invention may be best understood by reference to the following description taken in conjunction with the accompanying drawings, in which like reference numerals identify like elements, and in which.

Figure 1:
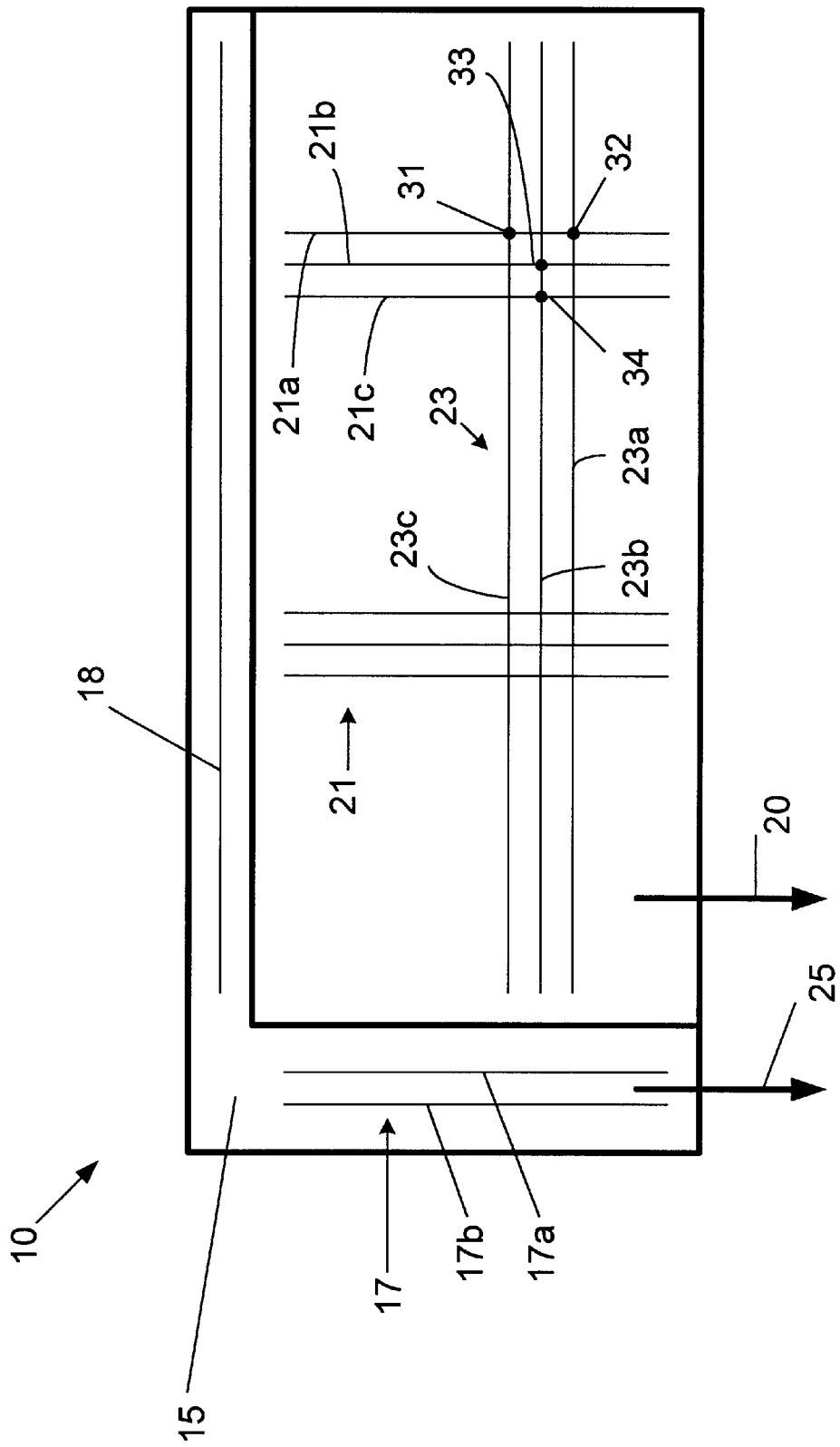
FIG. 1 illustrates memory array having redundant rows and redundant columns.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As will be readily apparent to those skilled in the art upon a complete reading of the present application, the present invention may be implemented using a variety of technologies, e.g., NMOS, PMOS, CMOS, BiCMOS, etc., and is readily applicable to a variety of devices, including, but not limited to, memory devices, memory arrays in microprocessors, memory arrays in logic devices, etc. Moreover, the present invention may be applied to a device using any kind of semiconductor substrate material, such as silicon, germanium, GaAs, or other semiconductor material.

FIG. 1 illustrates a 64K byte sub-array 10 that may be included in a semiconductor memory device. For example, a semiconductor memory array of 32 megabytes ($2^{25}$ bytes) storage capacity may be divided into 512 sub-arrays of 64 K bytes ($2^{16}$ bytes) each. As those of ordinary skill in the art will appreciate upon a complete reading of this disclosure, the sub-array may be a part of a larger array in a semiconductor memory device (e.g., a DRAM, SRAM, etc.), or it may comprise an on-chip array or part of an on-chip array included on a semiconductor die with a microprocessor or other logic circuitry. The sub-array 10 may also comprise a memory die coupled to and packaged with a separate logic or microprocessor die. Thus, the specific circuitry of which the sub-array 10 is a part should not be considered as a limitation on the present invention unless it is specifically set forth in the appended claims.

Adjacent the 64K byte memory locations in the sub-array 10 is a redundant section 15 having two redundant rows 17 and one redundant column 18. In many devices, the redundant section 15 may include many of these redundant rows and columns. However, for purposes of explanation, only two redundant rows 17 and one redundant column 18 are shown. By means of column decoding circuitry (not shown), data may be coupled out of memory cells in the sub-array 10 by an input/output line 20. When one or more of the redundant rows 17 or the redundant column 18 in the redundant section 15 is utilized, data may be coupled out of memory cells in the redundant section 15 by means of a redundant input/output line 25. As will be appreciated by those of ordinary skill in the art, the redundant rows 17 and redundant column 18 in the redundant section 15 may be used to replace rows 21 or columns 23 in the sub-array 10 that may have defective memory cells. Thus, by programming redundant row or column decoding circuitry (not shown) to respond to the address of a row 21 or a column 23 having a defective memory cell in the sub-array 10, a defective memory cell within the sub-array 10 may be replaced by a viable memory cell in the redundant section 15, and an other-wise unusable semiconductor memory device can be salvaged.

As an example of how defective memory cells in the sub-array 10 may be replaced by viable memory cells in the redundant section 15, consider defective memory cells 31, 32, 33, 34 shown in FIG. 1. Defective memory cells 31, 32 are located on row 21a, with defective memory cell 31 located on column 23c and defective memory cell 32 located on column 23a. To replace the defective memory cells 31, 32, a redundant row 17a may be made to replace the row 21a. Thus, a single redundant row 17a may be used to "repair" two defective memory cells 31, 32. Defective memory cell 33 is located on row 21b, and defective memory cell 34 is located on row 21c. However, both defective memory cells 33, 34 are located on column 23b. Therefore, both defective memory cells 33, 34 may be "repaired" by replacing the column 23b with the redundant column 18. In this manner, although defective memory cells are located on three different rows 21a, 21b, 21c, a single redundant row 17a and a single redundant column 18 are sufficient to completely repair the sub-array 10.

In general, detecting a multiple row failure may be accomplished by looking at bits in groups of columns with the row. If there is a bit failure in an "even" column and a bit failure in an "odd" column, then there is a multiple row failure. If there is a bit failure in the first or second bit of each group of four adjacent bits and there is a bit failure in the third or fourth bit of each group of four adjacent bits, then there is a multiple bit failure. If there is a bit failure in the first, second, third or fourth bit of each adjacent group of eight bits and there is a bit failure in the fifth, sixth, seventh or eighth bit in each group of eight adjacent bits, then there is a multiple bit failure. And so on, until if there is a failure in the first half of adjacent bits and there is a failure in the second half of adjacent bits, then there is a multiple bit failure. Each operation can be built by performing a logical "OR" operation on a first half of the column bits and then on the second half of the column bits, then performing a logical "AND" operation on the results of the two "OR" operations.

In one particular embodiment of the present invention, a processing unit having a CPU core, a set of storage arrays (caches, tags) and a programmable test unit may be implemented in hardware. A built-in self-test (BIST) of the storage arrays includes a march test designed to run after reset of the processing unit. Those of ordinary skill in the art will understand how to build a BIST controller for storage arrays. In one embodiment of the present invention, as the storage arrays are tested, a set of row and column failure registers, in combination with a state machine, may be used to efficiently assign rows and columns to be repaired, providing a built-in self-repair (BISR) of the storage array. In this particular embodiment, after the repaired rows and columns are assigned, a second BIST test is done to verify the repairs.

Figure 2:
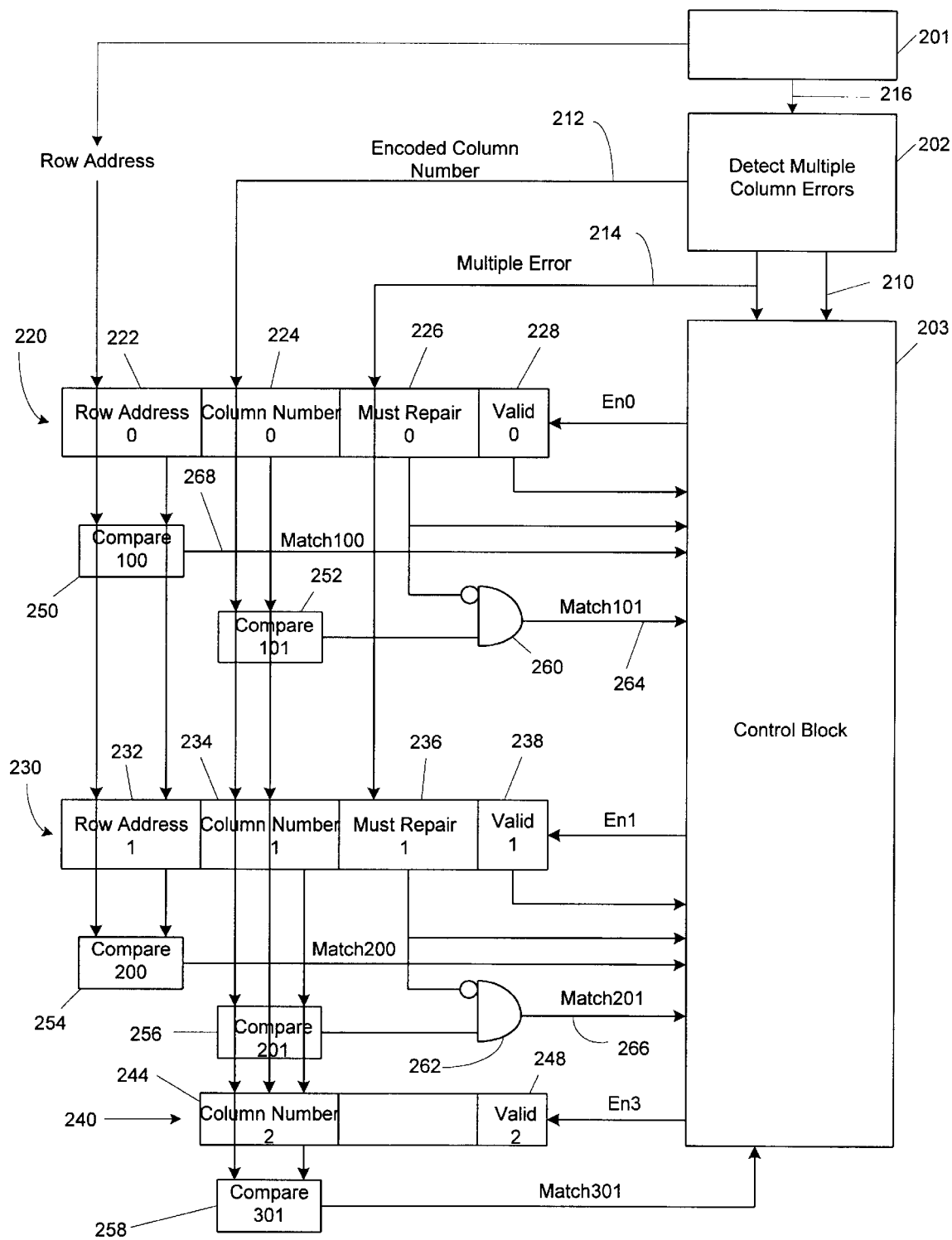
FIG. 2 illustrates one particular embodiment of an apparatus that utilizes aspects of the present invention.

Referring to FIG. 2, a test unit 201, an error detection unit 202 and a control block 203 are implemented in hardware to repair a storage array containing two redundant rows and one redundant column. The test unit 201 contains a pass to enable repair using the redundant rows and column. During the repair pass, the error detection unit 202 provides an error indication on a line 210, an encoded column number on a line 212 for the bit that failed, and an indicator on a line 214 that more than one column (bit) failed. The control block 203 keeps track of errors and decides whether to repair the failure with one of the redundant rows or the redundant column. The specific embodiment described herein utilizes two redundant rows and one redundant column. As those of ordinary skill in the art will appreciate upon a complete reading of this disclosure, an integrated circuit device that employs more redundant rows and columns may also utilize the present invention to advantage.

The test unit 201 comprises a logic circuit whose function it is to generate the signals necessary to test the rows of memory cells in the array in sequence. That is, the test unit 201 may implement a method for applying signals to memory cells on a row in the array to determine whether any of the memory cells are defective and, if so, the column(s) to which they are coupled. The test unit 201 progresses through the entire array checking each row in sequence to determine the locations (row and column) of all defective memory cells. Those of ordinary skill in the art, given the benefit of this disclosure, will understand the operation of the test unit 201 and understand various implementations of such a test unit.

The error detection unit 202 comprises a logic circuit coupled to the test unit 201, and it receives, on a line 216, results of a test on a row of the array. The test unit 201 executes a test of a row in the array and passes the results of that test to the error detection unit 202. The test unit 201 then proceeds to the next row in the array, executes a test of that row, and passes the results of that test to the error detection unit 202. The test unit 201 continues to repeat this process until all rows in the array have been tested. The error detection unit 202 generates three signals—error indication (on line 210), column number for a failing memory cell (on line 212), and multiple error indication (on line 214). Those of ordinary skill in the art, given the benefit of this disclosure, will understand the operation of the error detection unit 202 and understand various implementations of such an error detection unit.

Figure 3:
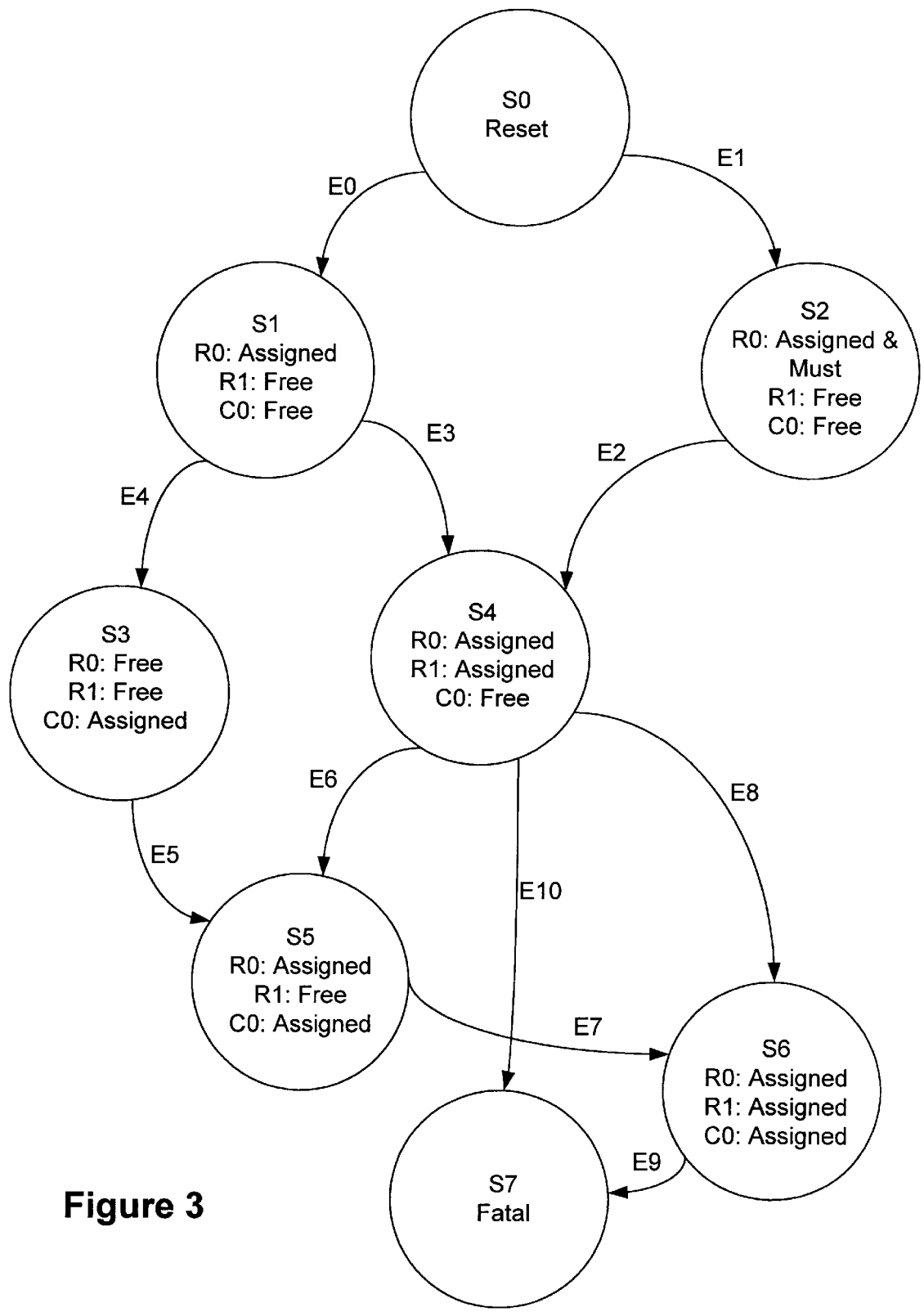
FIG. 3 illustrates a state diagram for the state machine component of the apparatus of FIG. 2.

The control block 203 comprises a three-bit state machine that receives input signals from the error detection unit 202 and determines how defective memory cells should be replaced, that is, how the redundant rows and redundant column are to be assigned in the memory array. FIG. 3 illustrates a state diagram for the control block 203 used in the particular embodiment shown in FIG. 2. Those of ordinary skill in the art, given the benefit of this disclosure, will appreciate that the state machine of the control block 203 may be implemented using any of a variety of appropriate technologies and methods.

Returning to FIG. 2, coupled to the error detection unit 202 and to the control block 203 are various registers, comparators and logic circuitry. A register 220 comprises a collection of storage locations 222, 224, 226, 228. A register 230 comprises a collection of storage locations 232, 234, 236, 238. A register 240 comprises a collection of storage locations 244, 248. Comparators 250, 252, 254, 256, 258 and logic gates 260, 262 are coupled to the registers 220, 230, 240 and to the control block 203 and assist in determining the assignment of the redundant rows and redundant column to replace defective memory cells in the memory array.

The operation of the apparatus of FIG. 2 will now be explained with reference to FIGS. 2 and 3. At the beginning of the test for defective memory cells, the control block 203 is initialized to state 0 (S0). In this state, no errors are programmed. During the repair pass, the test unit 201 enables the control block 203. If the error detection unit 202 reports an error, the control block 203 will move to one of two possible states depending on the error reported. If a single bit error is detected (path E0), the control block 203 will enter state S1 where the address of the row on which the error occurred is stored in the storage location 222 (Row Address 0 (R0)) of the register 220. The Valid bit (Valid 0) in the storage location 228 is set, and the address of the column that contained the failed memory cell is saved in the storage location 224 (Column Number 0).

If the error detection unit 202 reports more than one bit failing on a given row (path E1), the control block 203 enters a state S2. In this state, the storage location 222 (Row Address 0) stores the address of the row that contained the error. The Valid bit (Valid 0) is set, and the "Must Repair 0" status bit in the storage location 226 is set, indicating that the failure can only be repaired using a redundant row. The "Column Number 0" information in the storage location 224 will not be valid since more than one bit failed. The "Match101" and "Match201" signals on the lines 264, 266 are qualified with their respective "Must Repair" bits in storage locations 226, 236 to prevent their participating in a column match if the "Must Repair" bits are set.

If the control block 203 is in state S1, there again are two possible next-state points, S3 and S4. The S3 state is arrived at via path E4. The conditions required for taking the E4 path are: (1) that the failing column matches "Column Number 0" and (2) the row address does not match "Row Address 0." In other words, to determine the first condition for a transition from S1 to S3, the comparator 252 will compare the next failing column number with the "Column Number 0" stored in the storage location 224 to determine if they match. If they do match, and the "Must Repair 0" bit in the storage location is not set, the logic gate 260 will generate a signal "Match101" on the line 264. The logic gate 260 comprises an AND gate with its input from the storage location 226 inverted. To determine the second condition, the comparator 250 will compare the failing row number with the "Row Address 0" stored in the storage location 222. If the two do not match, the second condition for transition from state S1 to state S3 is satisfied. The comparator 250 supplies its output signal "Match100" to the control block 203 by way of the line 268. In state S3, the previously assigned "Row Address 0" in the storage location 222 is freed by clearing the "Valid 0" bit in the storage location 228. "(Column Number 2," in storage location 244, is assigned to the failing column and "Valid 2," in storage location 248, is set.

The S4 state is arrived at from the S1 state via path E3. The conditions required for taking the E3 path are that the failing row does not match "Row Address 0" in storage location 222. That is, the "Match100" signal on the line 268 from the comparator 250 indicates the two did not match. The new failure can be either a single or multiple bit failure. For a single bit failure, the failing row address is placed in the storage location 232 ("Row Address 1"), the failing column is stored in the storage location 234 ("Column Number 1"), and "Valid 1" in the storage location 238 is set. For a multiple bit failure, the existing data in the storage locations 222, 224 are transferred to the storage locations 232, 234, respectively. The new failing row is stored in the storage location 222 and the "Must Repair 0" bit in storage location 226 is set. The E2 path can also be taken from state S2 to state S4 if the failing row does not match "Row Address 0," as determined by the comparator 250. In this case, it does not matter whether there is a single or multiple bit failure since the failing row will be stored in storage location 232 ("Row Address 1") and "Valid 1" in storage location 238 will be set. For a multiple bit failure, the "Must Repair 1" bit in storage location 236 will also be set.

If the control block 203 is in state S3 or state S4, paths E5 and E6 take the control block 203 to state S5. The E5 path can be taken as a result of either a single or a multiple bit error where the error must not match "Column Number 2," as determined by the comparator 258. The failing row is assigned to "Row Address 0" in the storage location 222, and "Valid 0" in the storage location 228 is set. If there is a multiple bit failure, then "Must Repair 0" in the storage location 226 will also be set. The E6 path requires that there be a single bit error that matches "Column Number 1," as determined by the comparator 256. In this case, "Row Address 1" in the storage location 232 is freed by clearing "Valid 1" in the storage location 238. The failing column is stored in storage location 244 ("Column Number 2"), and "Valid 2" in the storage location 248 is set.

If the control block 203 is in state S5 or state S4, paths E7 and E8 take the control block 203 to state S6. In state S6, all redundant rows and the redundant columns have been assigned. The E7 path is taken when there is either a single or multiple bit error that does not match "Row Number 0," as determined by the comparator 250, and the failing bit does not match "Column Number 2," as determined by the comparator 258. For a single bit error, the storage location 232 ("Row Address 1") is assigned the failing row number, the storage location 234 ("Column Number 1") gets the failing bit number, and "Valid 1" in the storage location 238 is set. For a multiple bit error, if "Must Repair 0" in the storage location 226 is clear, "Row Address 0" in the storage location 222 is transferred to "Row Address 1" in the storage location 232, "Column Number 0" in the storage location 224 is transferred to "Column Number 1" in the storage location 234, and the new failing row is stored in the storage location 222 ("Row Address 0"). The "Must Repair 0" bit of the storage location 226 is set as well. If there is a multiple bit error and "Must Repair 0" is already set, then "Row Address 1" in the storage location 232 is assigned the failing row number, "Column Number 1" in the storage location 234 gets the failing bit number, "Valid 1" in the storage location 238 is set, and "Must Repair 1" in the storage location 236 is set.

The E8 path is taken when there is a new error and it does not match "Row Address 0" or "Row Address 1." The new error can be either a single or multiple bit error, though a multiple bit error will not be repairable if "Must Repair 0" and "Must Repair 1" are already set. For a single bit error, the column address for the failing bit is stored in "Column Number 2" and "Valid 2" is set. For a multiple bit error, if "Must Repair 0" is not set, "Column Number 0" is stored in "Column Number 2" and "Valid 2" is set. The new failure is stored in "Row Address 0" and "Must Repair 0" is set. If "Must Repair 0" is set and "Must Repair 1" is not set, then "Column Number 1" is stored in "Column Number 2" and "Valid 2" is set. The new failure is stored in "Row Address 1" and "Must Repair 1" is set.

If the control block 203 is in state S6 and a new error is received, if the new error does not match "Row Address 0" ("!Match100") or "Row Address 1" ("!Match200"), or the failing bit does not match "Column Number 2" ("!Match301"), then the new failure is not repairable, and the E9 path is taken to state S7. The E10 path can also be taken from S6 to S7. The E10 path occurs when "Must Repair 0" and "Must Repair 1" are already set and an additional multiple bit failure is encountered.

After the first self-test pass is complete and the built-in self-repair apparatus has assigned row and columns to be replaced, the state machine of the control block 203 is locked, and a second self-test pass is performed. Any failures found in the second pass will cause a transition from any state to state S7, indicating a fatal error. If no failures are found in the second pass, the state machine of the control block 203 holds the repaired state resulting from the first pass.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit device, comprising:
   a memory array having a plurality of memory cells arranged in a plurality of rows and a plurality of columns, each row and each column having coupled to it a plurality of memory cells;
   a first redundant row of memory cells;
   a first redundant column of memory cells;
   a test circuit coupled to the memory array and adapted to test the plurality of memory cells coupled to each of the plurality of rows;
   a control circuit coupled to the test circuit and adapted to receive test results from the test circuit, the control circuit adapted to respond to a detection of a defective memory cell to determine an assignment of at least one of the first redundant row and first redundant column;
   a first register coupled to the control circuit and adapted to receive an assignment of the first redundant row in response to a determination by the control circuit; and
   a second register coupled to the control circuit and adapted to receive an assignment of the first redundant column in response to a determination by the control circuit.

2. The integrated circuit device of claim 1, further comprising:
   a second redundant row of memory cells; and,
   a third register coupled to the control circuit,
   the control circuit adapted to respond to a detection of a defective memory cell to determine an assignment of at least one of the first and second redundant rows and the first redundant column, and the third register adapted to receive an assignment of the second redundant row in response to a determination by the control circuit.

3. The integrated circuit device of claim 1, further comprising a first comparator coupled to the first register and coupled to receive a row address from the test unit, the first comparator adapted to compare the row address to an assignment in the first register and provide a signal to the control circuit.

4. The integrated circuit device of claim 2, further comprising a first comparator coupled to the first register and coupled to receive a row address from the test unit, the first comparator adapted to compare the row address to an assignment in the first register and provide a signal to the control circuit.

5. The integrated circuit device of claim 3, further comprising a second comparator coupled to the first register and coupled to receive a column address from the test unit, the second comparator adapted to compare the column address to an assignment in the first register and provide an output signal.

6. The integrated circuit device of claim 5, further comprising a first logic circuit having first and second input terminals and an output terminal, the first input terminal coupled to the first register, the second input terminal coupled to receive the output signal from the second comparator, and the output terminal coupled to the control circuit.

7. The integrated circuit device of claim 4, further comprising a second comparator coupled to the first register and coupled to receive a column address from the test unit, the second comparator adapted to compare the column address to an assignment in the first register and provide an output signal.

8. The integrated circuit device of claim 7, further comprising a first logic circuit having first and second input terminals and an output terminal, the first input terminal coupled to the first register, the second input terminal coupled to receive the output signal from the second comparator, and the output terminal coupled to the control circuit.

9. The integrated circuit device of claim 8, further comprising a third comparator coupled to the third register and coupled to receive a row address from the test unit, the third comparator adapted to compare the row address to an assignment in the third register and provide a signal to the control circuit.

10. The integrated circuit device of claim 9, further comprising a fourth comparator coupled to the third register and coupled to receive a column address from the test unit, the fourth comparator adapted to compare the column address to an assignment in the third register and provide an output signal.

11. The integrated circuit device of claim 10, further comprising a second logic circuit having first and second input terminals and an output terminal, the first input terminal coupled to the third register, the second input terminal coupled to receive the output signal from the fourth comparator, and the output terminal coupled to the control circuit.

12. The integrated circuit device of claim 11, further comprising a fifth comparator coupled to the second register and coupled to receive a column address from the test unit, the fifth comparator adapted to compare the column address to an assignment in the second register and provide a signal to the control circuit.

13. A method for replacing defective memory cells in a memory array, comprising:
   testing a first row of memory cells in the memory array;
   detecting a first defective memory cell coupled to the first row;
   providing, to a control circuit, row information and column information associated with the first defective memory cell;
   determining an assignment of one of a redundant row and redundant column to replace the first row;
   storing the assignment in a register.

14. The method of claim 13, wherein storing the assignment in a register comprises storing the row information and the column information in a first redundant row register.

15. The method of claim 13, wherein detecting a first defective memory cell coupled to the first row further comprises detecting first and second defective memory cells coupled to the first row; and
   wherein providing, to a control circuit, row information and column information associated with the first defective memory cell further comprises providing, to a control circuit, row information and column information associated with the first defective memory cell and providing, to the control circuit, row information and column information associated with the second defective memory cell.

16. The method of claim 15, wherein storing the assignment in a register comprises storing, in a first redundant row register, the row information associated with the first and second defective memory cells.

17. The method of claim 16, further comprising:
   testing a second row of memory cells in the memory array;
   detecting a first defective memory cell coupled to the second row; and
   providing, to the control circuit, row information and column information associated with the first defective memory cell coupled to the second row.

18. The method of claim 17, further comprising storing the row information and column information associated with the first defective memory cell coupled to the second row in a second redundant row register.

19. The method of claim 17, further comprising:
   storing, in a second redundant row register, the row information stored in the first redundant row register; and
   storing, in the first redundant row register, the row information and column information associated with the first defective memory cell coupled to the second row.

20. The method of claim 18, further comprising:
   testing a third row of memory cells in the memory array;
   detecting a first defective memory cell coupled to the third row; providing row information and column information associated with the first defective memory cell coupled to the third row to the control circuit; and
   comparing the column information associated with the first defective memory cell coupled to the third row with the column information stored in the second redundant row register.

21. The method of claim 20, further comprising:
   in response to a match between the column information associated with the first defective memory cell coupled to the third row and the column information stored in the second redundant row register, storing, in a redundant column register, the column information associated with the first defective memory cell coupled to the third row, and releasing the second redundant row register to receive additional row information.

22. The method of claim 20, further comprising:
   in response to a mismatch between the column information associated with the first defective memory cell coupled to the third row and the column information stored in the second redundant row register, storing the column information associated with the first defective memory cell coupled to the third row in a redundant column register.

23. The method of claim 21, further comprising:
   testing a fourth row of memory cells in the memory array;
   detecting a first defective memory cell coupled to the fourth row;
   providing row information and column information associated with the first defective memory cell coupled to the fourth row to the control circuit;
   comparing the column information associated with the first defective memory cell coupled to the fourth row with the column information stored in the redundant column register; and
   in response to a mismatch between the column information associated with the first defective memory cell coupled to the fourth row and the column information stored in the redundant column register, and storing the row information and column information associated with the first defective memory cell coupled to the fourth row in the second redundant row register.

24. The method of claim 17, wherein detecting a first defective memory cell coupled to the second row further comprises detecting first and second defective memory cells coupled to the second row; and wherein providing, to the control circuit, row information and column information associated with the first defective memory cell coupled to the second row further comprises providing, to the control circuit, row information and column information associated with the first defective memory cell coupled to the second row and providing, to the control circuit, row information and column information associated with the second defective memory cell coupled to the second row.

25. The method of claim 24, further comprising storing, in a second redundant row register, the row information associated with the first defective memory cell coupled to the second row.

26. The method of claim 14, further comprising:

testing a second row of memory cells in the memory array;

detecting a first defective memory cell coupled to the second row;

providing, to the control circuit, row information and column information associated with the first defective memory cell coupled to the second row; and comparing the column information associated with the first defective memory cell coupled to the second row with the column information stored in the first redundant row register.

27. The method of claim 26, further comprising:

in response to a match between the column information associated with the first defective memory cell coupled to the second row and the column information stored in the first redundant row register, storing, in a redundant column register, the column information associated with the first defective memory cell coupled to the second row, and releasing the first redundant row register to receive additional row information.

28. The method of claim 26, further comprising:

in response to a mismatch between the column information associated with the first defective memory cell coupled to the second row and the column information stored in the first redundant row register, storing, in a second redundant row register, the row information and the column information associated with the first defective memory cell coupled to the second row.

29. The method of claim 26, further comprising:

in response to a mismatch between the column information associated with the first defective memory cell coupled to the second row and the column information stored in the first redundant row register, storing, in a second redundant row register, the row information and the column information stored in the first redundant row register, and storing, in the first redundant row register, the row information and the column information associated with the first defective memory cell coupled to the second row.

30. The method of claim 26, wherein detecting a first defective memory cell coupled to the second row further comprises detecting first and second defective memory cells coupled to the second row, the method further comprising:

storing, in a second redundant row register, the row information and the column information stored in the first redundant row register; and storing, in the first redundant row register, the row information associated with the first defective memory cell coupled to the second row.

31. The method of claim 27, further comprising:

testing a third row of memory cells in the memory array;

detecting a first defective memory cell coupled to the third row;

providing, to the control circuit, row information and column information associated with the first defective memory cell coupled to the third row; and storing, in the first redundant row register, the row information and the column information associated with the first defective memory cell coupled to the third row.

32. The method of claim 31, further comprising:

testing a fourth row of memory cells in the memory array;

detecting a first defective memory cell coupled to the fourth row;

providing row information and column information associated with the first defective memory cell coupled to the fourth row to the control circuit;

comparing the column information associated with the first defective memory cell coupled to the fourth row with the column information stored in the redundant column register; and in response to a mismatch between the column information associated with the first defective memory cell coupled to the fourth row and the column information stored in the redundant column register, and storing the row information and column information associated with the first defective memory cell coupled to the fourth row in the second redundant row register.

* * * * *